United States Patent [19]

Hartlaub

[11] 3,994,009

[45] Nov. 23, 1976

[54] STRESS SENSOR DIAPHRAGMS OVER RECESSED SUBSTRATES

[75] Inventor: Jerome T. Hartlaub, New Brighton, Minn.

[73] Assignee: Honeywell Inc., Minneapolis, Minn.

[22] Filed: Sept. 6, 1974

[21] Appl. No.: 503,902

Related U.S. Application Data

[62] Division of Ser. No. 331,934, Feb. 12, 1973.

[52] U.S. Cl. .............................. 357/26; 73/88.5 SD
[51] Int. Cl.² ................. H01L 29/84; H01L 29/96; G01B 7/16; G01N 3/00
[58] Field of Search ................... 357/26; 73/88.5 SD

[56] References Cited

UNITED STATES PATENTS

| | | |
|---|---|---|
| 3,215,568 | 11/1965 | Pfann .................................. 357/26 |
| 3,537,319 | 11/1970 | Yerman .............................. 357/26 |
| 3,614,678 | 10/1971 | Engeler ............................... 357/26 |
| 3,739,315 | 6/1973 | Kurtz .................................. 73/88.5 |
| 3,757,414 | 9/1973 | Keller ................................. 357/26 |
| 3,758,830 | 9/1973 | Jackson ............................. 357/55 |
| 3,764,950 | 10/1973 | Willia ................................. 357/26 |

FOREIGN PATENTS OR APPLICATIONS

| | | | |
|---|---|---|---|
| 923,153 | 4/1963 | United Kingdom ................... | 357/26 |

*Primary Examiner*—Andrew J. James
*Attorney, Agent, or Firm*—Theodore F. Neils

[57] ABSTRACT

A semiconductor layer to serve as a diaphragm is provided over a substrate having recesses therein. The recesses are formed after the semiconductor layer has been provided by differential etching. A convenient semiconductor layer is an epitaxially grown layer in which sensing elements are provided.

8 Claims, 5 Drawing Figures

STRESS SENSOR DIAPHRAGMS OVER RECESSED SUBSTRATES

This is a division, of application Ser. No. 331,934, filed Feb. 12, 1973.

BACKGROUND OF THE INVENTION

This invention relates to semiconductor strain sensors.

As is well known, silicon has piezoresistive characteristics which vary with respect to the crystal planes chosen in which to measure such characteristics. This piezoresistive property of silicon allows fabrication of silicon stress sensitive sensors. A thin silicon disk with its major surface substantially parallel to crystal planes of a selected orientation and having sensing elements diffused through this surface serves as a diaphragm to receive applied forces. The strain occurring in the silicon in conjunction with the stress due to these applied forces results in resistance changes in the diffused sensing elements because of the piezoresistive characteristics of the silicon disk, i.e. diaphragm.

Properly constraining such a silicon diaphragm at its periphery is very important for proper operation of the stress sensor. Unsatisfactory constraints lead to error stresses being introduced both by poor bonding and by differences between the thermal coefficients of expansion of the diaphragm and the constraint. Such unsatisfactory constraints will limit the accuracy of the stress sensor.

It has previously been suggested that a satisfactory constraint for a silicon diaphragm would be one constructed of the same or a sufficiently similar material. This is usually accomplished by preparing the diaphragm and the constraint as two separate silicon components to be later joined together to form the stress sensor. Such methods require added handling and therefore expense. It also is often times difficult to obtain proper relationships concerning the relative location between the diffused resistors and the constrained periphery of the silicon diaphragm. Further, in some instances the diaphragm-constraint interface does not form properly. Therefore, an improved method of forming a constraint for a silicon diaphragm, to be used as a stress sensor, in a batch process is desirable.

SUMMARY OF THE INVENTION

The method of the present invention proceeds by the provision of a region in a substrate material that is subject to being etched away much more rapidly than are other portions of the substrate material which adjoin this rapid etch region. The rapid etch region is formed through a major surface of the substrate. A convenient substrate material is a semiconductor material allowing the rapid etch region to be formed by a deep impurity diffusion with a high surface concentration.

Provision is made for a layer of semiconductor material to cover the rapid etch region. This semiconductor layer has an exposed outer major surface opposite the substrate. Regions for sensing elements can be formed in this semiconductor layer at its exposed outer major surface either at this point in the process or they may be provided subsequently after the diaphragm has been formed.

The substrate has a major surface opposite the substrate side associated with the semiconductor layer. Access is provided to the rapid etch region from this latter substrate major surface at points of this surface opposite the rapid etch region. A differential etching process is performed in this access such that the rapid etch region is rapidly etched away while the other portions of the substrate present remain substantially so. As indicated above, the diffused regions may be formed in the semiconductor layer provided on the substrate at this point of the process.

If the semiconductor layer provided over the rapid etch region is an epitaxial layer, a silicon stress sensitive sensor results having diffused regions in the epitaxial layer for sensing elements. These sensing elements are preferably circuit resistors in most instances, although other circuit components may be used for signal processing or even the sensing. These resistors serve to exploit the piezoresistive characteristic of the silicon when connected into suitable circuitry and so provide a stress sensor device.

DESCRIPTION OF THE PREFERRED EMBODIMENTS

Figure 1:
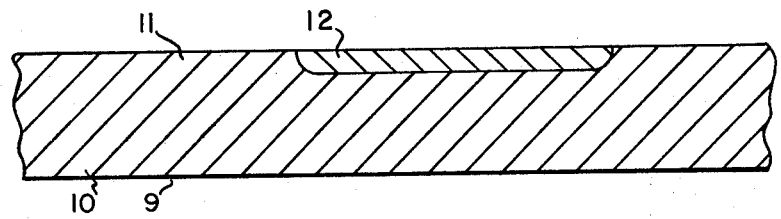
FIG. 1 through 5 illustrate the results of various steps in the method of the invention with FIG. 5 showning a device resulting from the use of this method.

Referring now to FIG. 1, a p type conductivity silicon substrate 10 is provided having first major surface 11 and second major surface 9. Typically, the substrate is 10 to 14 mils thick and has a resistivity of around 0.5 to 5 ohm-cm. A silicon wafer doped with boron is satisfactory to provide substrate 10 although other materials which can form a satisfactory silicon diaphragm constraint can be used if a satisfactory rapid etch region can be formed therein and a layer of semiconductor material can be formed thereon. For the proper piezoresistive effect to subsequently appear, the first major surface 11 is chosen to be in the (100) crystal plane orientation though there are other possibilities such as the (110) orientation.

A deeply diffused region 12, extending to perhaps 35 microns in depth, is then conveniently provided as a rapid etch region in substrate 10 through first major surface 11 by known diffusion methods. Diffused region 12 is to subsequently define the approximate extent of a diaphragm and is chosen to be circular in shape when viewed from above major surface 11. Region 12 has a p+ type conductivity and low sheet resistivity of something typically under 10 ohms/square. A diffused region 12 having these characteristics can result, as an example, from a boron diffusion into substrate 10 through surface 11 at 1150° C for 66 hours using standard diffusion methods. Region 12, as a rapid etch region, can be effectively provided using other means such as particle bombardment, for instance, ion implantation.

Figure 2:
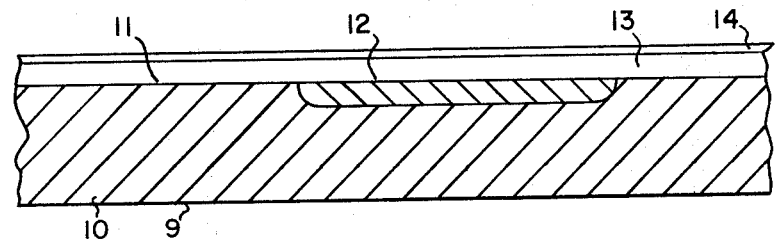

A silicon epitaxial layer 13, having a resistivity of around 5 ohm-cm., is then conveniently grown on major surface 11 over diffused region 12 to thereby serve as part of the boundary of region 12. The result is shown in FIG. 2. This epitaxial layer will form the diaphragm portion of the stress sensor and so may be chosen from 0.2 to 2 mils in thickness depending on the desired stress sensor characteristics. This epitaxial layer 13 may be grown by standard epitaxial methods to provide an n type conductivity layer. As is standard, an oxide layer 14 is grown on outer major surface 15 of epitaxial layer 13.

Figure 3:
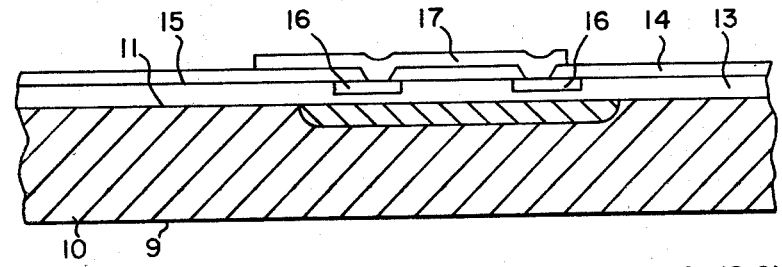

As presented in FIG. 3, resistors 16 of p type conductivity are then formed by standard diffusion techniques in epitaxial layer 13. The resistors 16 are to be located in epitaxial layer 13 over diffused region 12 as shown in FIG. 3. These resistors are chosen to be in positions to optimally exploit the piezoresistive characteristics of the epitaxial layer 13 with this layer behaving as a diaphragm over a void existing where diffused region 12 is shown while constrained by the remainder of substrate 10. The removal of region 12 is set out below. Epitaxial layer 13, in growing, continues the crystal orientation of major surface 11 upon which it is grown. Thus, outer major surface 15 of epitaxial layer 13 is in the (100) orientation which determines, in part, the piezoresistive characteristic that will be effective in resistors 16. Other types of components may also be used with or in place of resistors 16 to provide a similar sensing of stress due to applied force or sensing other variables such as temperature. Also, additional components of various types may be provided in epitaxial layer 13 over or near diffused region 12 to provide other circuit functions such as further processing of sensing element signals.

Resistors 16 are diffused in an oxidizing atmosphere so that upon completion of their diffusion, silicon dioxide layer 14 is again complete over resistors 16 at outer major surface 15. Openings are to be provided in this silicon dioxide layer using ordinary methods to permit the metallization interconnection network, shown in part as metallization 17 in FIG. 3, to make ohmic contact with the resistors 16. The metallization interconnection network 17 provides for interconnection between the resistors 16 and external connections made to lands provided in the network. Aluminum deposition by standard methods is satisfactory for this interconnection network.

Figure 4:
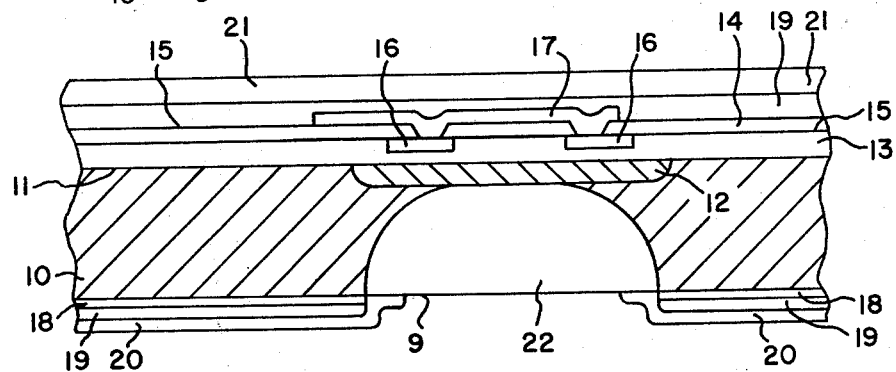

FIG. 4 shows the result of several further steps. Next, gold layer 18 is deposited on second major surface 9 of substrate 10. Gold layer 18 and silicon dioxide layer 14 are each then covered simultaneously with photoresist layers shown as layers 19. The photoresist layer 19 on silicon dioxide layer 14 and on the metallization 17 is placed there to protect the surfaces it covers. The photoresist layer 19 on gold layer 18 is opened opposite diffused region 12 and gold layer 18 is etched away within this opening. These steps are performed by the use of well known methods.

An access to diffused region 12 is now provided from the exposed portion of second major surface 9 as contained within the openings provided above in gold layer 18. Since this is most conveniently provided by etching, a second photoresist layer 20 is provided, as a mask for a chemical etch, over that first photoresist layer 19 that covers gold layer 18. An opening is made in the second photoresist layer 20 to expose most of the substrate exposed by the earlier etching of gold layer 18 but the diameter of the opening in the photoresist is kept small enough so that the edges of gold layer 18 are covered by the portions of second photoresist layer 20 remaining after the opening is made therein. A standard silicon chemical etching bath is then applied to the exposed portion of second major surface 9 through the opening in photoresist layer 20. The result is shown as cavity 22 in FIG. 4.

To provide a better control of this chemical etch, it is desirable in some instances to have a smaller substrate distance through which the chemical etch must proceed to reach diffused region 12. In such a case, the substrate may be lapped off at second major surface 9 after completing the method steps to reach the result shown in the FIG. 3 which is just prior to depositing gold layer 18. A lapping such that the thickness of the device, at the point in processing shown in FIG. 3, comes to 6 to 8 mils has been found satisfactory.

It is also desirable to provide a backing or support for the device during processing in some instances. This may be provided by a wax layer placed on the photoresist layer 19 provided on silicon dioxide layer 14 as shown in FIG. 4. The wax layer is so provided just prior to beginning the chemical etch.

Upon the completion of the chemical etching step, another small opening is made in photoresist layers 19 and 20 to expose a portion of gold layer 18 and an electrical contact is made to this layer. A connection from a voltage supply is made to gold layer 18 through the contact made in this opening. The device as connected is then placed in an etching bath to effectively serve as a first electrode. A second, separate electrode is also placed in the bath. This latter electrode is connected to the other side of the voltage supply. A voltage of around a half a volt is impressed between the device of FIG. 4 as connected and the second electrode while both are in the bath to begin an electrochemical etching step. A typical bath comprising a mixture of sulphuric acid, hydrofluoric acid and water in the ratio 1:1:5 has been found effective.

If the gold layer 18 isn't needed for further functions in the completed device, such as to aid in mounting the device, only a small metal patch on surface 9 would be needed as a point to make contact for the electrochemical etch rather than gold layer 18. A photoresist layer would be the etching mask in this latter method as photoresist layer 20 is in the method described above. However, it is also possible in the method described above to have gold layer 18 as the etching mask but in most instances the gold layer will be an inferior etching mask.

Figure 5:
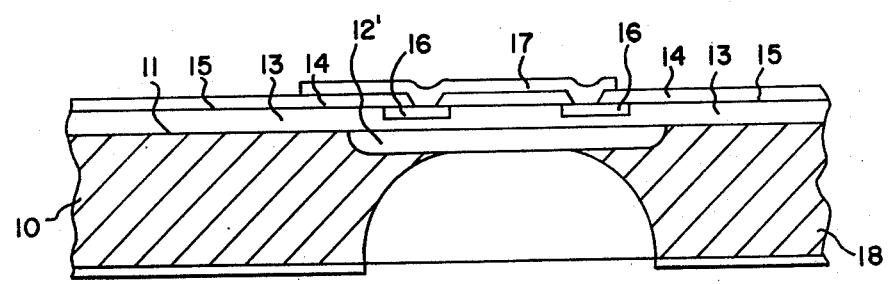

It has been found during the electrochemical etching step that the material in the diffused region 12 is etched away at a rate of around 100 times faster than the remaining material in the other portions of the substrate 10 and similarly faster than the material in the epitaxial layer 13. Therefore a void is etched out where diffused region 12 has been since the material of diffused region 12 is etched away at such a much greater rate than the material at its boundaries. The result of this differential etching is shown in FIG. 5 where the void is labeled 12'. The current carried by the circuit consisting of the voltage source, the device of FIG. 4 as connected, the second terminal and the etching bath will drop abruptly upon completion of the etching away of diffused region 12 to indicate that void 12' has been formed.

The access to the rapid etch region shown as cavity 22 in FIG. 4 could be formed by substituting an electrochemical etch for the chemical etching step described above. Differential etching would begin when the rapid etch region was reached.

The void 12' formed next to epitaxial layer 13 leaves that portion of epitaxial layer 13 covering void 12' effectively a constrained diaphragm. This diaphragm is constrained by the remaining portions of substrate 10 from which only an insignificant amount of material has been removed in the electrochemical etching step. Thus, upon sawing the completed wafer to separate the several simultaneously constructed devices similar to the one shown in FIG. 5 and upon mounting one of these devices, a stress sensor of the desired type results.

The embodiments of the invention in which an exclusive:

1. A semiconductor material stress sensitive sensor comprising:
    a substrate of semiconductor material having a first major surface and a second major surface opposite one another, said substrate having a recess provided therein opening at said first major surface without said recess intersecting said second major surface,
    an epitaxial layer of semiconductor material of a first conductivity type on said first major surface entirely covering said recess, and
    a region formed in a portion of said epitaxial layer, said region being of a second conductivity type differing from said first conductivtiy type.

2. The device of claim 1 wherein said region is located within a projected boundary of said recess and is a circuit component with a protective layer thereover having an electrical contact made thereto through an opening in said protective layer by a metallization network.

3. A semiconductor material stress sensitive sensor comprising:
    a substrate of semiconductor material having a first major surface and a second major surface opposite one another, said substrate having a recess provided therein opening at said first major surface without said recess intersecting said second major surface,
    a thin layer of semiconductor material of a first conductivity type on said first major surface entirely covering said recess, said thin layer being in a substantially crystalline structure with said substrate, and
    a region formed in a portion of said thin layer, said region being of a second conductivity type differing from said first conductivity type.

4. The device of claim 3 wherein an access is provided from said second surface to said recess.

5. The device of claim 3 wherein said region is located within a projected boundary of said recess and is a circuit component with a protective layer thereover having an electrical contact made thereto through an opening in said protective layer by a metallization network.

6. The device of claim 4 wherein said region is located within a projected boundary of said recess and is a circuit component with a protective layer thereover having an electrical contact made thereto through an opening in said protective layer by a metallization network.

7. The device of claim 1 wherein an access is provided from said second surface to said recess.

8. The device of claim 7 wherein said region is located within a projected boundary of said recess and is a circuit component with a protected layer thereover having an electrical contact made thereto through an opening in said protective layer by a metallization network.

* * * * *